United States Patent
Greywall et al.

(10) Patent No.: US 7,429,858 B2
(45) Date of Patent: Sep. 30, 2008

(54) OSCILLATING-BEAM MAGNETOMETER

(75) Inventors: Dennis S. Greywall, Whitehouse Station, NJ (US); Bernard Yurke, Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 108 days.

(21) Appl. No.: 11/391,538

(22) Filed: Mar. 28, 2006

(65) Prior Publication Data

US 2006/0181273 A1    Aug. 17, 2006

(51) Int. Cl.
*G01R 33/02* (2006.01)
(52) U.S. Cl. .......................................... 324/244; 331/65
(58) Field of Classification Search ................. 324/244, 324/249, 256–260, 226, 261, 247, 661; 73/862.54, 73/862.69, 862.68; 331/65
See application file for complete search history.

(56) References Cited

U.S. PATENT DOCUMENTS

| | | | |
|---|---|---|---|
| 4,680,544 A | 7/1987 | Rudolf | 324/259 |
| 5,442,288 A | 8/1995 | Fenn et al. | 324/244 |
| 5,644,230 A | 7/1997 | Pant et al. | 324/247 |
| 5,731,703 A | 3/1998 | Bernstein et al. | 324/256 |
| 5,998,995 A | 12/1999 | Osiander et al. | 324/259 |
| 6,275,034 B1 | 8/2001 | Tran et al. | 324/252 |
| 6,486,665 B1 | 11/2002 | Funk et al. | 324/260 |
| 6,714,007 B2 | 3/2004 | Youngner | 324/244.1 |

FOREIGN PATENT DOCUMENTS

EP        0 392 945 A1    10/1990

OTHER PUBLICATIONS

"Theory of Amplifier-Noise Evasion in an Oscillator Employing a Nonlinear Resonator," by B. Yurke et al., Physical Review A, May 1995, vol. 51, No. 5, pp. 4211-4229.

*Primary Examiner*—Reena Aurora

(57) ABSTRACT

In one embodiment, an integrated magnetometer has a deformable, electrically conducting beam that is mounted on a substrate and adapted to oscillate with respect to the substrate. When the oscillating beam is exposed to a magnetic field, the magnetic field induces an oscillating electromotive force that generates an oscillating electrical signal along the beam. The magnetometer has a detection circuit that detects this oscillating electrical signal and, based on the results of this detection, determines the magnetic-field strength and/or the magnetic-field gradient.

26 Claims, 11 Drawing Sheets

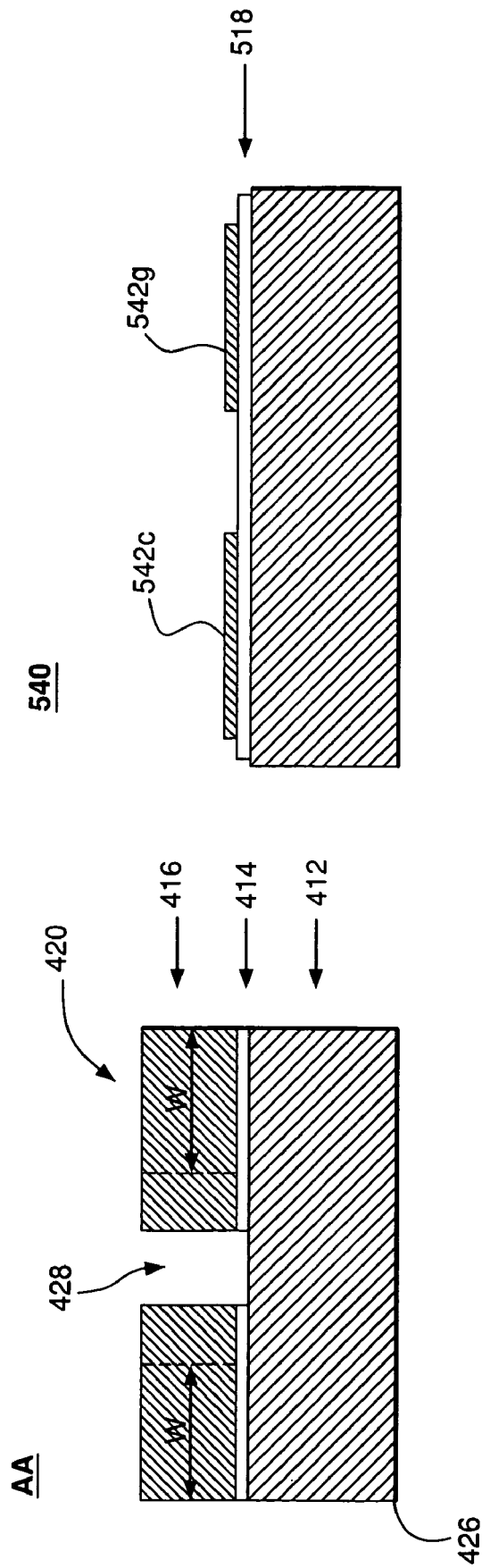

OSCILLATING-BEAM MAGNETOMETER

CROSS-REFERENCE TO RELATED APPLICATIONS

This application is related to U.S. patent application Ser. No. 10/889,970, filed Jul. 13, 2004, and entitled "Magnetometer Having an Electromechanical Resonator," which is incorporated herein by reference in its entirety.

BACKGROUND OF THE INVENTION

1. Field of the Invention

The present invention relates to magnetometers and, more specifically, to magnetometers based on micro-electromechanical systems (MEMS).

2. Description of the Related Art

Magnetometers are widely used in a variety of applications, such as extraterrestrial exploration, industrial process sensors, medical imaging equipment, scientific equipment, and detection of mineral deposits and submerged ships. Current trends in magnetometer design and development are toward smaller size, lower power consumption, and lower cost for a desired set of performance characteristics. Examples of prior-art miniature magnetometers can be found in U.S. Pat. Nos. 5,998,995, 5,731,703, and 5,644,230, the teachings of all of which are incorporated herein by reference.

One problem with prior-art miniature magnetometers is that they typically include strong micro-magnets, either permanent or electric. Permanent micro-magnets require magnetic (e.g., ferromagnetic and/or magnetostrictive) materials that are relatively difficult to process and integrate into the magnetometer structure with conventional micro-fabrication techniques. Micro-electromagnets, while relatively easy to manufacture, require passage of electrical current, which may cause excessive heating and/or unacceptably high power consumption. In addition, in a magnetometer having two or more magnetic sensors, the permanent or electric magnets of those sensors might interfere with each other, thereby distorting the measurement results generated by each of the sensors.

SUMMARY OF THE INVENTION

Problems in the prior art are addressed by various embodiments of a magnetometer having a deformable, electrically conducting beam that is supported on a substrate and adapted to oscillate with respect to the substrate. When the oscillating beam is exposed to a magnetic field, the magnetic field induces an oscillating electro-motive force that generates an oscillating electrical signal along the beam. The magnetometer has a detection circuit that detects this oscillating electrical signal and, based on the results of this detection, determines the magnetic-field strength and/or the magnetic-field gradient.

In one embodiment, a magnetometer of the invention incorporates a MEMS device having two parallel beam members, each physically fixed at each end to the substrate and to the respective end of the other beam member such as to define an opening between the beam members. A periodic drive signal applied to a drive electrode that is located within this opening in proximity to the beam members induces oscillation of both beam members. Two spirally shaped conducting tracks on the device surface are configured such that at least two sections of the first track belonging to different turns of that track's spiral are laid over the first beam member side by side to each other, and at least two sections of the second track belonging to different turns of that track's spiral are similarly laid over the second beam member. In one wiring configuration, the first and second conducting tracks are serially connected to each other such that, in the presence of a magnetic field, the oscillating beam members induce, between the end terminals of the connected tracks, an oscillating electrical signal indicative of the magnetic-field strength. In another wiring configuration, the first and second conducting tracks are serially connected to each other such that, in the presence of a magnetic field, the oscillating beam members induce, between the end terminals of the connected tracks, an oscillating electrical signal indicative of the magnetic-field gradient.

According to one embodiment, the present invention is an apparatus comprising: (A) an oscillator; (B) a beam having an electrical pathway along its length, wherein the oscillator is configured to mechanically oscillate the beam to generate an oscillating electrical signal in the pathway in response to the beam being oscillated in a magnetic field; and (C) a detection circuit electrically coupled to the pathway and being configured to generate a measure of the magnetic field based on the oscillating electrical signal.

According to another embodiment, the present invention is a method of generating a measure of a magnetic field comprising the steps of: (A) oscillating a beam with respect to a substrate supporting the beam; (B) while oscillating the beam, exposing the beam to the magnetic field such that the magnetic field causes an oscillating electrical signal to be generated in an electrical pathway along the beam; and (C) measuring the oscillating electrical signal to generate the measure of the magnetic-field.

BRIEF DESCRIPTION OF THE DRAWINGS

Other aspects, features, and benefits of the present invention will become more fully apparent from the following detailed description, the appended claims, and the accompanying drawings in which:

FIGS. 4A-B show a MEMS device that can be used as a sensor in the magnetometer of FIG. 1 according to another embodiment of the invention;

FIGS. 5A-D show a MEMS device that can be used as a sensor in the magnetometer of FIG. 1 according to yet another embodiment of the invention;

DETAILED DESCRIPTION

Figure 1:
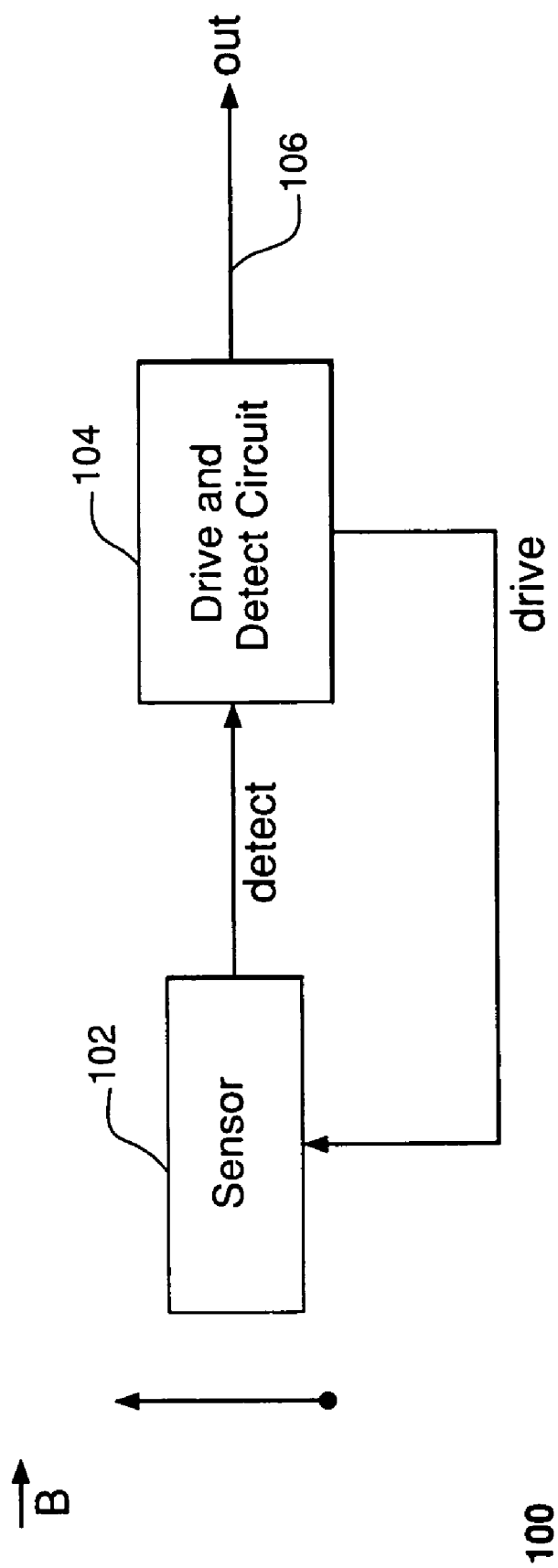
FIG. 1 shows a block diagram of a magnetometer according to one embodiment of the invention.

FIG. 1 shows a block diagram of a magnetometer 100 according to one embodiment of the invention. Magnetometer 100 includes a magnetic-field sensor 102 coupled to a drive-and-detect (DD) circuit 104. Sensor 102 has a conductor (not shown) that can be driven by DD circuit 104 to mechanically oscillate with respect to the stationary part of the sensor. It is known that, when a moving (e.g., oscillating) conductor is placed in a magnetic field, B, the magnetic field induces across the conductor a voltage that is related to the magnitude of that magnetic-field component. DD circuit 104 is configured to measure the induced voltage and then output the measurement result via an output signal 106 to an external processor (not shown) that may then, based on the output signal, derive the magnitude of the magnetic-field component corresponding to the orientation of the conductor and the motion vector with respect to the magnetic field. In an alternative embodiment, DD circuit 104 has an internal processor (not shown) adapted to produce output signal 106 that directly represents (e.g., in a digital form) the strength of that magnetic-field component.

In one embodiment, sensor 102 has three differently oriented conductors (not shown) that are adapted to be driven by DD circuit 104 to oscillate along three different (e.g., mutually orthogonal) directions. As a result, each of the three conductors is sensitive to a magnetic-field component that is different from each of the magnetic-field components to which the other two conductors are sensitive. DD circuit 104 is adapted to measure each of the three voltages induced across the three conductors and provide the measurement results to the internal or external processor. Based on these measurement results, the conductor geometry, and the oscillation amplitudes, the processor then derives the strength and orientation of magnetic field B.

Figure 2:
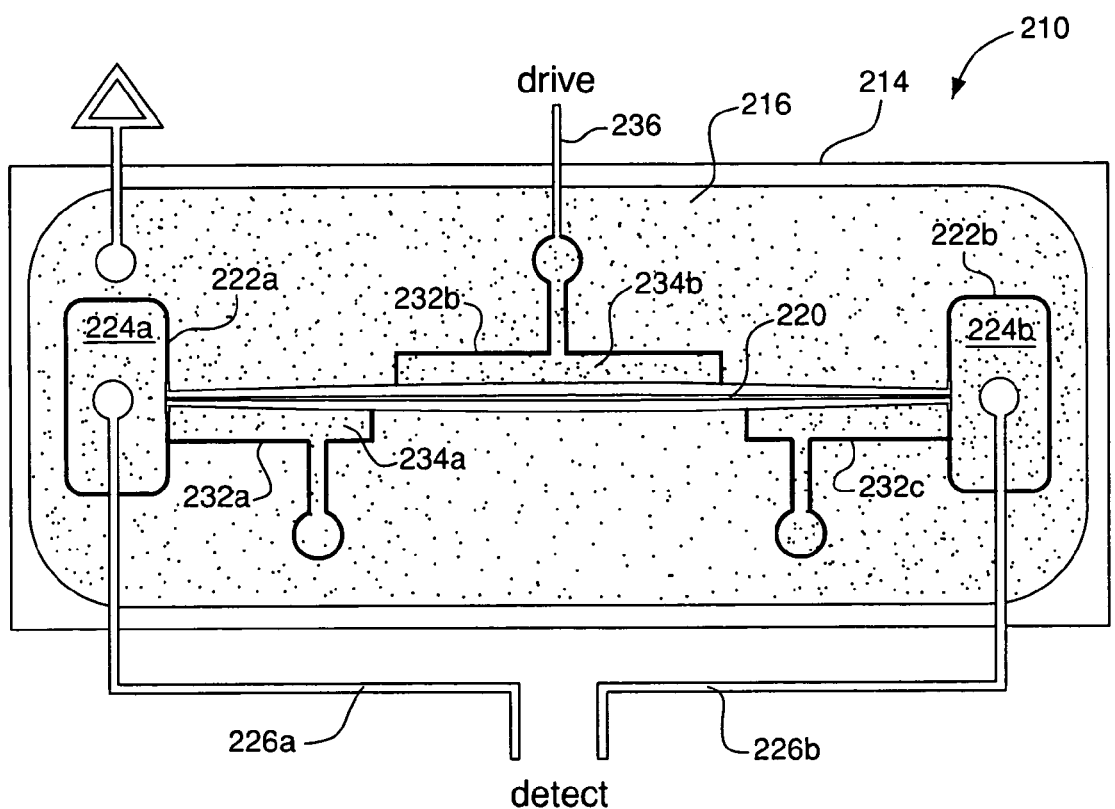
FIG. 2 shows a top view of a MEMS device that can be used as a sensor in the magnetometer of FIG. 1 according to one embodiment of the invention.

FIG. 2 shows a top view of a MEMS device 202 that can be used as sensor 102 in magnetometer 100 according to one embodiment of the invention. Device 202 is fabricated using a silicon-on-insulator (SOI) wafer 210. Wafer 210 has (i) two silicon layers, only one of which, i.e., an overlayer 216, is visible in the view of FIG. 2, and (ii) a silicon oxide layer 214 located between overlayer 216 and the second silicon (i.e., substrate) layer that is not visible well in FIG. 2, except for the narrow strips of that layer around the device edges. The substrate layer provides support for the device structure; silicon oxide layer 214 provides electrical insulation between overlayer 216 and the substrate layer; and overlayer 216 is used to define certain structural elements of the device, each of which elements is described in more detail below.

Device 202 includes a conducting deformable beam 220 that is attached between contact pads 224a-b. Beam 220 and pads 224a-b are formed from overlayer 216. More specifically, portions of silicon oxide layer 214 and the substrate layer located in proximity to and beneath beam 220 are removed to release the beam and make it movable with respect to the rest of the device structure. Each of contact pads 224a-b is defined in overlayer 216 by a respective one of trenches 222a-b that is etched through the overlayer all the way down to silicon oxide layer 214. Due to the electrical insulation provided by trenches 222a-b and layer 214, beam 220 and pads 224a-b are electrically isolated from the rest of the device structure. A pair of wires 226a-b that are attached to pads 224a-b form a detect line for connecting beam 220 to a DD circuit, e.g., DD circuit 104 of FIG. 1. In one embodiment, the top surfaces of beam 220 and pads 224a-b are covered by a thin metal (e.g., gold) film for better electrical conductivity.

Device 202 further includes three electrodes 234a-c, each of which is defined in overlayer 216 by a respective one of trenches 232a-c, which trenches are similar to trenches 222a-b. Since each of electrodes 234a-c is electrically isolated from the rest of the device structure, each electrode can be independently biased, e.g., with respect to beam 220. As such, any one of electrodes 234a-c can be used to receive a drive signal, e.g., from DD circuit 104 of FIG. 1. For illustration purposes, FIG. 2 shows a configuration in which a drive signal wire 236 is attached to electrode 234b. Alternatively, wire 236 can be attached to electrode 234a or electrode 234b. Wiring configurations, in which the drive signal(s) are applied to more than one electrode are also possible.

When a periodic (e.g., sinusoidal) drive signal is applied to a selected one of electrodes 234a-c, it generates an oscillating attractive force between the electrode and beam 220, which causes the beam to oscillate about an equilibrium position corresponding to the time-averaged value of the attractive force. Since the attractive force is proportional to the square of the voltage differential between electrode 234 and beam 220, the time-averaged force value produced by a drive signal of alternating polarity is generally not zero, and the oscillation of the beam has a second harmonic of the drive signal. On the other hand, if a periodic drive signal having a fixed polarity (e.g., a biased sinusoidal signal) is used, then beam 220 generally oscillates with the frequency of the drive signal.

Figure 3:
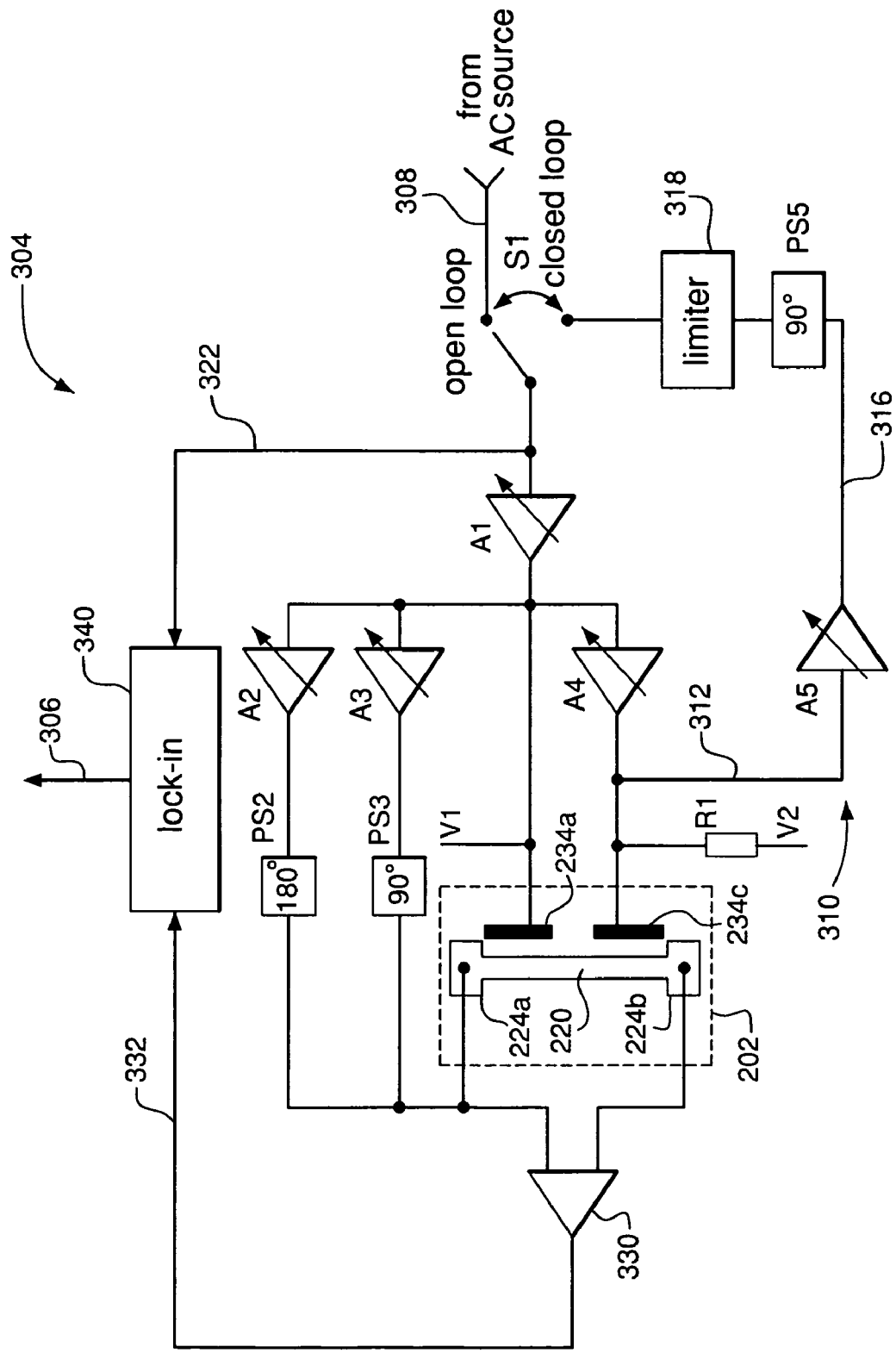
FIG. 3 shows a block diagram of a drive-and-detect (DD) circuit that can be used in the magnetometer of FIG. 1 according to one embodiment of the present invention.

FIG. 3 shows a block diagram of a DD circuit 304 that can be used as DD circuit 104 in magnetometer 100 according to one embodiment of the invention. Illustratively, DD circuit 304 is shown connected to device 202 of FIG. 2. Note, however, that the wiring configuration of device 202 in FIG. 3 is different from that in FIG. 2. More specifically, in the configuration of FIG. 3, DD circuit 304 is connected to electrodes 234a and 234c, while, in the configuration of FIG. 2, the corresponding DD circuit is connected to electrode 234b.

DD circuit 304 has a switch S1 that controls the operating mode of the circuit. More specifically, to enable an open-loop mode, switch S1 is configured to couple electrode 234a to an external AC source (not shown). Alternatively, to enable a closed-loop mode, switch S1 is configured to couple electrode 234c, via a feedback loop 310, to electrode 234a. Each of these operating modes of DD circuit 304 is described in more detail below.

Referring first to the open-loop mode of DD circuit 304, a reference AC signal 308 received from an external AC source is amplified using a variable-gain amplifier A1. The resulting amplified signal is appropriately biased using bias voltage V1 and applied to electrode 234a as a drive signal of fixed polarity. In the presence of an external magnetic field orthogonal to beam 220, the beam oscillation induced by the drive signal causes an oscillating voltage differential to appear between contact pads 224a-b. As already explained above, the amplitude of this oscillating voltage differential is indicative of the magnetic-field strength. An amplifier 330 connected to contact pads 224a-b amplifies the signal picked up at the pads and a resulting amplified signal 332 is applied to a lock-in detector 340. To enable lock-in detection of signal 332 at detector 340, the input signal received by amplifier A1 is branched out and applied to the lock-in detector as a reference signal 322. Using signal 322, detector 340 measures the amplitude of the corresponding frequency component in signal 332 and outputs the measurement result as an output signal 306 that is analogous, e.g., to output signal 106 of FIG. 1. In one embodiment, detector 340 is an SR830 lock-in amplifier commercially available from Stanford Research Systems, Inc., of Sunnyvale, Calif.

DD circuit 304 further includes two optional compensation paths, the first compensation path having a variable-gain amplifier A3 and a phase shifter PS3, and the second compensation path having a variable-gain amplifier A2 and a phase shifter PS2. The first compensation path is configured to reduce electrical crosstalk between signal 332 and the drive signal. More specifically, due to capacitive coupling between beam 220 and drive electrode 234a, the drive signal "leaks" through the capacitor formed by the beam and the drive electrode to create a background signal component that will be present in signal 332 even if there is no magnetic field and/or the beam is not vibrating. The first compensation path substantially cancels that background component by (i) appropriately amplifying the drive signal in variable-gain amplifier A3, (ii) phase-shifting the result by 90 degrees in phase shifter PS3 to account for the capacitive phase shift and create a signal that is out of phase with the leaked signal, and (iii) adding the out-of-phase signal to the signal that is picked up from pads 224a-b.

The second compensation path is configured to reduce the contribution of Earth's magnetic field into signal 332 or, alternatively, to make signal 332 more sensitive to local variations in Earth's magnetic field strength. More specifically, the gain of amplifier A2 is set to produce an output signal with an amplitude that is substantially equal to the amplitude of the signal picked up from pads 224a-b at a reference magnetic field strength. That output signal is appropriately phase shifted in phase shifter PS3 to be out of phase with the signal picked up from pads 224a-b and applied to the input of amplifier 330 to reduce by the corresponding amount the amplitude of signal 332. Due to the second compensation path, signal 306 will indicate the presence of a magnetic field substantially to the extent by which the magnetic field strength deviates from the reference magnetic field strength. If the reference magnetic field strength is selected to be a "standard" Earth's magnetic field strength at a given geographic location (which ranges from about 30 microtesla in most of South America and southern Africa to over about 60 microtesla around the magnetic poles in northern Canada and south of Australia), then signal 306 will be a measure of deviation of the ambient magnetic field strength from this "standard" magnetic field strength.

Referring now to the closed-loop mode of DD circuit 304, when switch S1 is flipped into the closed-loop configuration, electrodes 234c and 234a become coupled via an electrical path having a variable-gain amplifier A5, a phase shifter PS5, an amplitude limiter 318, and variable-gain amplifier A1. The cumulative gain of amplifiers A1 and A5 is set to a value that is high enough to cause the closed loop that includes (i) the capacitors formed by beam 220 and electrodes 234c and 234a and (ii) the above-specified electrical path between these electrodes to act as an effective signal generator that is prone to self-excitation, e.g., due to the thermal noise. Electrical characteristics of the closed loop are chosen such that the drive signal applied by this effective signal generator to electrode 234a has a frequency that is relatively close to the resonant oscillation frequency of beam 220.

Due to the oscillation of beam 220, the capacitance of the capacitor formed by the beam and electrode 234c (hereafter referred to as the sense capacitor) becomes time dependent. When both resistance of resistor R1 that connects electrode 234c to bias voltage V2 and the input impedance of amplifier A5 are relatively large, charge stored in the sense capacitor is substantially time-independent. A substantially constant charge stored in the time-dependent sense capacitor causes the voltage across the sense capacitor to oscillate with the same frequency as that of beam 220. This oscillating voltage, labeled as signal 312, is amplified using amplifier A5 to produce a signal 316. As explained in more detail in the above-cited, commonly owned U.S. patent application Ser. No. 10/889,970, the phase of signal 316 normally lags the phase of the drive signal by 90 degrees. This phase lag is eliminated by passing signal 316 through phase shifter PS5. The resulting phase-shifted signal is passed through amplitude limiter 318, which is configured to clip the passing signal if its magnitude exceeds a certain fixed value. The net effect of amplitude limiter 318 is to shape the drive signal applied to electrode 234a and to limit the amplitude of that signal. The output signal produced by amplitude limiter 318 is amplified using amplifier A1, biased using bias voltage V1, and applied to electrode 234a.

DD circuit 304 further includes a third optional compensation path having a variable-gain amplifier A4 and configured to reduce electrical crosstalk between signal 312 and the drive signal. More specifically, electrode 234a, beam 220, and electrode 234c form two serially connected capacitors that provide capacitive coupling between the drive signal and signal 312. As such, the drive signal "leaks" through these capacitors to create a parasitic signal component in signal 312. The third compensation path substantially cancels that parasitic component by appropriately amplifying the drive signal in variable-gain amplifier A4 and adding the resulting signal to signal 312. Since the parasitic component that leaks through two serially connected capacitors has a 180-degree phase shift with respect to the drive signal, the signal produced by amplifier A4 substantially cancels that parasitic component.

Detection of the signal picked up from pads 234a-b in the closed-loop configuration of DD circuit 304 is substantially analogous to that in the open-loop configuration. As such, functional description of the detection part of the circuit is not repeated here. Similar to the open-loop configuration, the above-described first and/or second compensation paths can be employed in the closed-loop configuration to (i) reduce electrical crosstalk between signal 332 and the drive signal applied by amplifier A1 to electrode 234a and/or (ii) make signal 332 more sensitive to local variations in the ambient magnetic field strength.

Figure 4A:
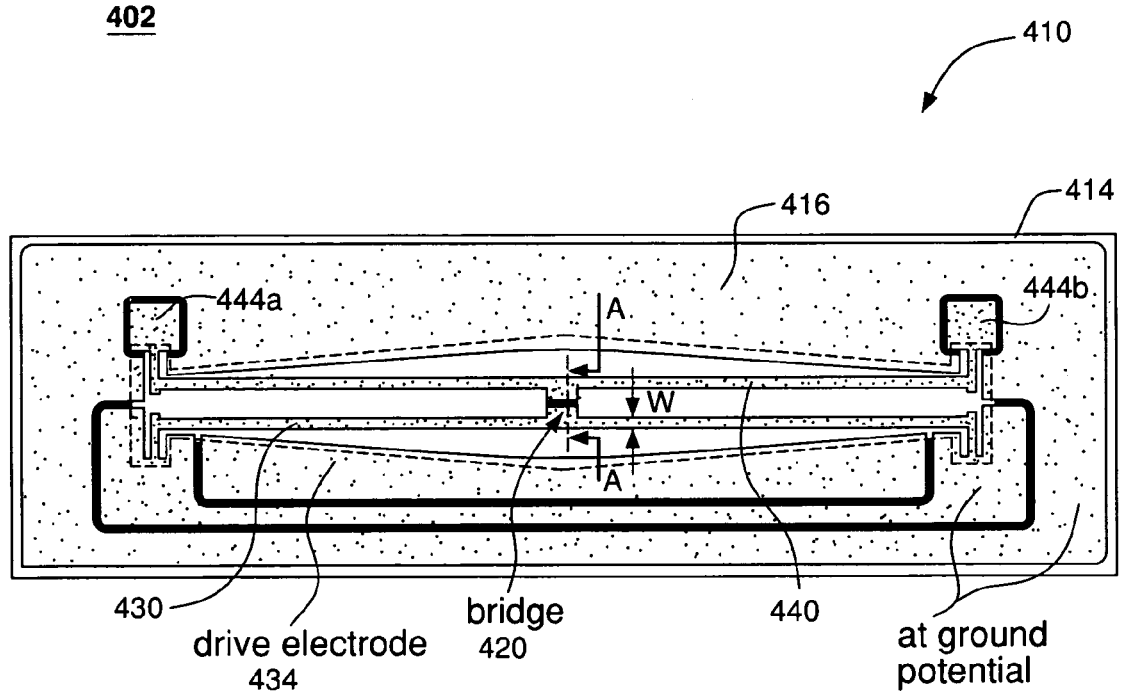

FIGS. 4A-B show a MEMS device 402 that can be used as sensor 102 in magnetometer 100 according to another embodiment of the invention. More specifically, FIG. 4A shows a top view of device 402, and FIG. 4B shows a side cross-sectional view of a beam-member bridge 420 in that device. In one embodiment, device 402 is fabricated using an SOI wafer 410 that is similar to wafer 210 of FIG. 2. Wafer 410 has (i) two silicon layers, i.e., an overlayer 416 and a substrate layer 412 (see FIG. 4B), and (ii) a silicon oxide layer 414 located between layers 412 and 416. Substrate layer 412 provides support for the device structure; silicon oxide layer 414 provides electrical insulation between layers 412 and 416; and overlayer 416 is used to define certain structural elements of the device.

Device 402 includes two conducting deformable beam members, i.e., a drive beam member 430 and a sense beam member 440, which beam members are mechanically coupled by bridge 420. Beam members 430 and 440 are formed from overlayer 416 by removing portions of silicon oxide layer 414 and substrate layer 412 located in proximity to and beneath these beam members. However, a portion of substrate layer 412 corresponding to bridge 420 is left intact to form a mechanical link 426 between beam members 430 and 440 as shown in FIG. 4B. While bridge 420 mechanically couples beam members 430 and 440, the bridge also provides electrical insulation between the beam members. More specifically, a trench 428 etched in the bridge material through layers 416 and 414 provides electrical insulation between beam members 430 and 440 within overlayer 416, while the underlying portions of silicon oxide layer 414 prevent the beam members from being electrically shorted by link 426 (see FIG. 4B).

A drive electrode 434 in device 402 is substantially analogous to electrode 234b in device 202 (FIG. 2). As a result, a periodic drive voltage applied between electrode 434 and drive beam member 430 causes the drive beam member to oscillate similar to beam 220 in device 202. Sense beam member 440 oscillates together with the drive beam member due to the mechanical link provided by bridge 420. In the presence of a magnetic field, this oscillation of sense beam member 440 produces an oscillating voltage between contact pads 444a-b, to which the ends of the sense beam member are electrically connected. This oscillating voltage can be picked up and detected, e.g., using an open-loop configuration of DD circuit 304 of FIG. 3, to determine the magnetic field strength.

The electrical insulation between mechanically coupled beam members 430 and 440 provided by bridge 420 might be advantageous in that it can reduce electrical crosstalk between the drive signal applied to device 402 and the output signal generated by that device compared to the corresponding electrical crosstalk in device 202. This reduction is primarily due to (i) the relatively weak capacitive coupling between the drive and detect lines connected to device 402 effectuated by a relatively large distance between sense beam member 440 and drive electrode 434 and (ii) the absence of direct electrical connection between the sense electrode and the capacitor formed by the drive electrode and drive beam member 430. One skilled in the art will appreciate that the relatively small electrical crosstalk produced in device 402 lends itself to relatively efficient compensation using, e.g., the first compensation path (having amplifier A3 and phase shifter PS3) in DD circuit 304 of FIG. 3.

Figure 5A:
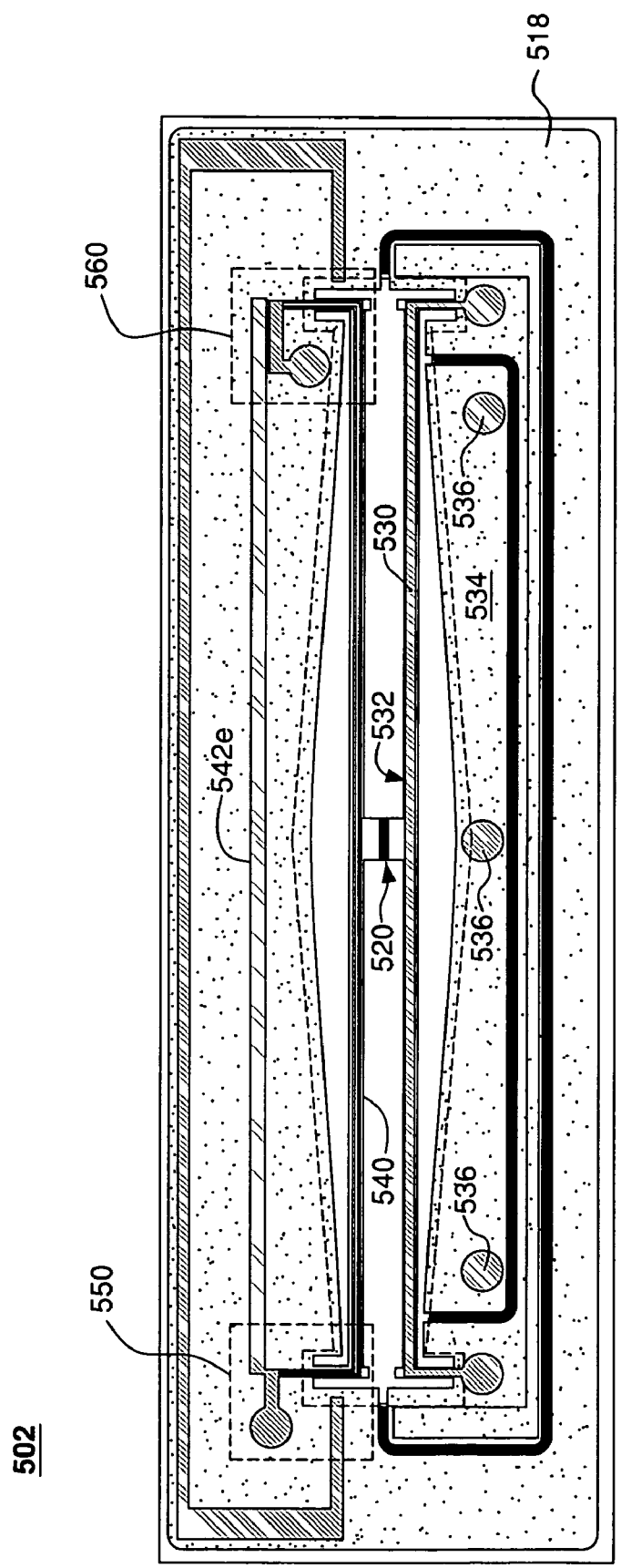
Figure 5B:
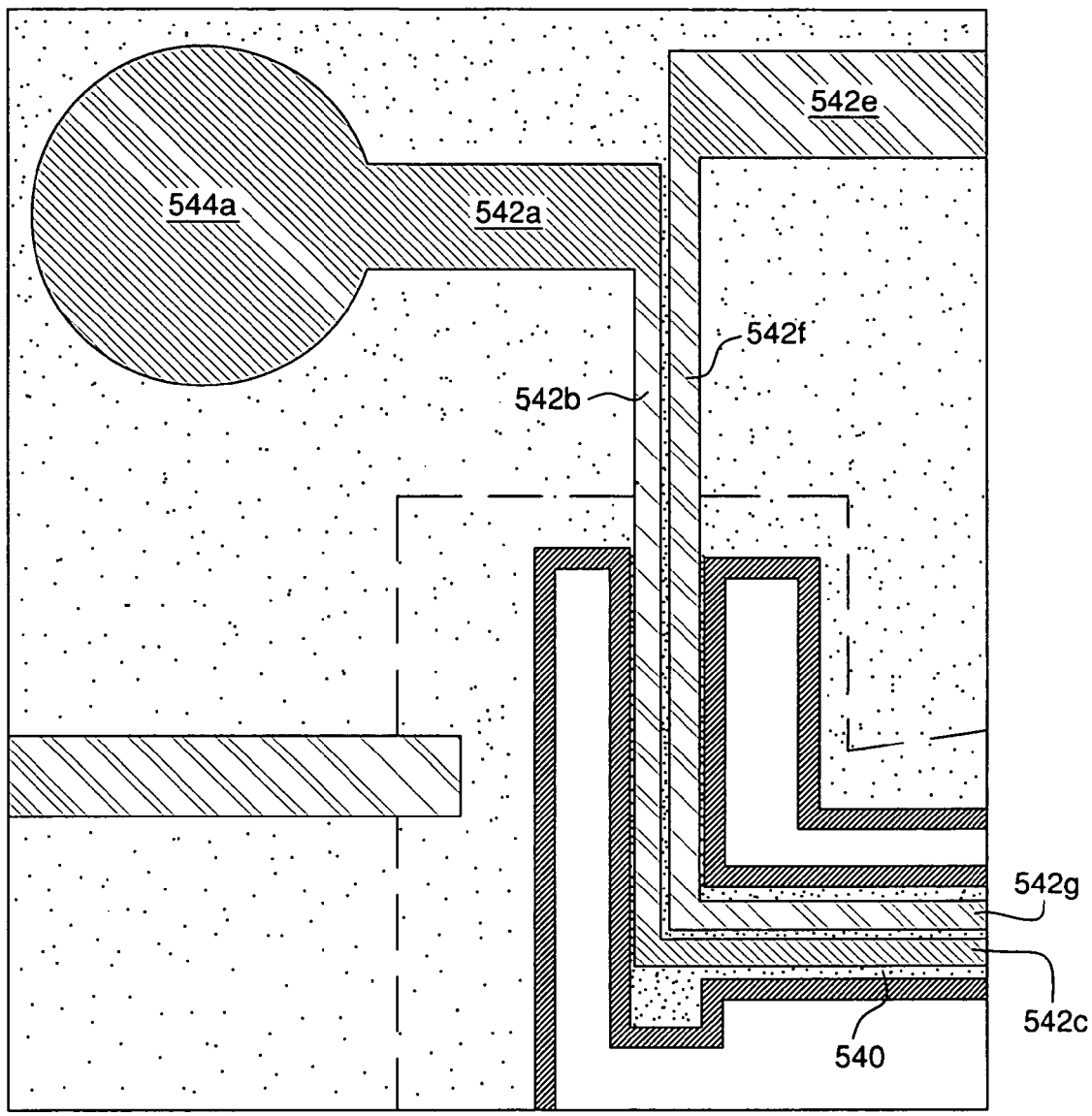
Figure 5C:
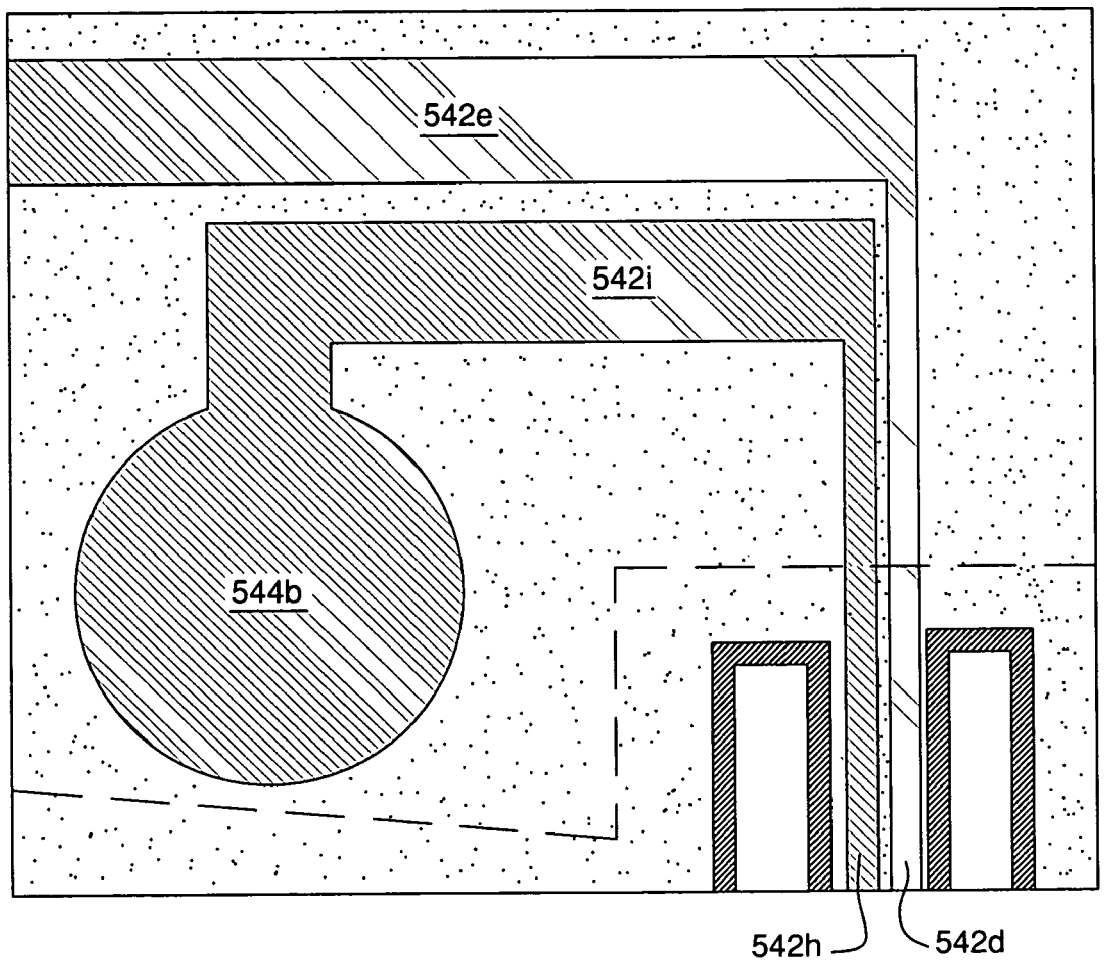

FIGS. 5A-D show a MEMS device 502 that can be used as sensor 102 in magnetometer 100 according to yet another embodiment of the invention. More specifically, FIG. 5A shows a top view of device 502; FIGS. 5B-C show enlarged top views of portions 550 and 560 of the device; and FIG. 5D shows a side cross-sectional view of a sense beam member 540 in the device. The structure of device 502 is generally analogous to that of device 402 (FIG. 2). In particular, device 502 has a drive electrode 534, a drive beam member 530, sense beam member 540, and a bridge 520 between the drive and sense beam members that are analogous to drive electrode 434, drive beam member 430, a sense beam member 440, and a bridge 420, respectively, of device 402. However, one difference between devices 402 and 502 is that the latter has an additional layer of material, i.e., a silicon nitride layer 518, deposited over the silicon overlayer of the SOI wafer. Since silicon nitride is an insulator, layer 518 has metal-plated openings (vias) 536 that can be used to deliver a drive signal to drive electrode 534. Another difference between devices 402 and 502 is that the latter has several conducting tracks laid over silicon nitride layer 518. More specifically, drive beam member 530 has a metal track 532 that serves to improve the drive beam member's electrical conductivity. Similarly, sense beam member 540 has two sections of a spirally shaped metal track 542, the layout and function of which are described in more detail below.

Metal track 542 begins at a contact pad 544a as shown in FIG. 5B, with track sections 542a and 542b going from that contact pad to the left terminus of sense beam member 540, where track section 542b connects with track section 542c. Track section 542c then runs along sense beam member 540 all the way to the right terminus of the sense beam member, where it connects with track section 542d, which can be seen in FIG. 5C. Track section 542d connects with track section 542e, which runs parallel to sense beam member 540 over the stationary part of device 502 (see FIGS. 5A-C). Track section 542e connects with track section 542f, which runs parallel to track section 542b as shown in FIG. 5B. Track section 542f goes to the left terminus of sense beam member 540, where it connects with track section 542g. Track section 542g then runs along sense beam member 540 (see FIGS. 5B and 5D) parallel to track section 542c all the way to the right terminus of the sense beam member, where track section 542g connects with track section 542h shown in FIG. 5C. Finally, track section 542h connects with track section 542i, which ends at a contact pad 544b (see FIG. 5C). Although, in the embodiment illustrated by FIG. 5, metal track 542 has two parallel sections running along sense beam member 540, in different embodiments, metal track 542 can be laid out in an inward spiraling manner to have three or more parallel sections belonging to different turns of the spiral that run along the sense beam member and connect to other track sections such that a line drawn along metal track 542 from contact pad 544a toward contact pad 544b always travels along the sense beam member in the same direction, e.g., in the view of FIG. 5A, from the left terminus of the sense beam member to its right terminus.

One purpose of having spirally shaped track 542 in device 502 is to increase the effective length of the sense beam member at least two-fold compared to that in similarly sized device 402 due to the presence of spiral track sections on sense beam member 540. The larger effective length is beneficial in that the amplitude of the oscillating signal produced by the device is generally proportional to the sense beam member's length. Thus, device 502 having two parallel sections of spiral track 542 over sense beam member 540 will produce a signal having an amplitude that is about twice as big as an amplitude of the signal produced by similarly configured device 402. An even greater signal enhancement can be achieved with an embodiment of device 502 having three or more parallel sections of spiral track 542 over sense beam member 540.

Figure 6:
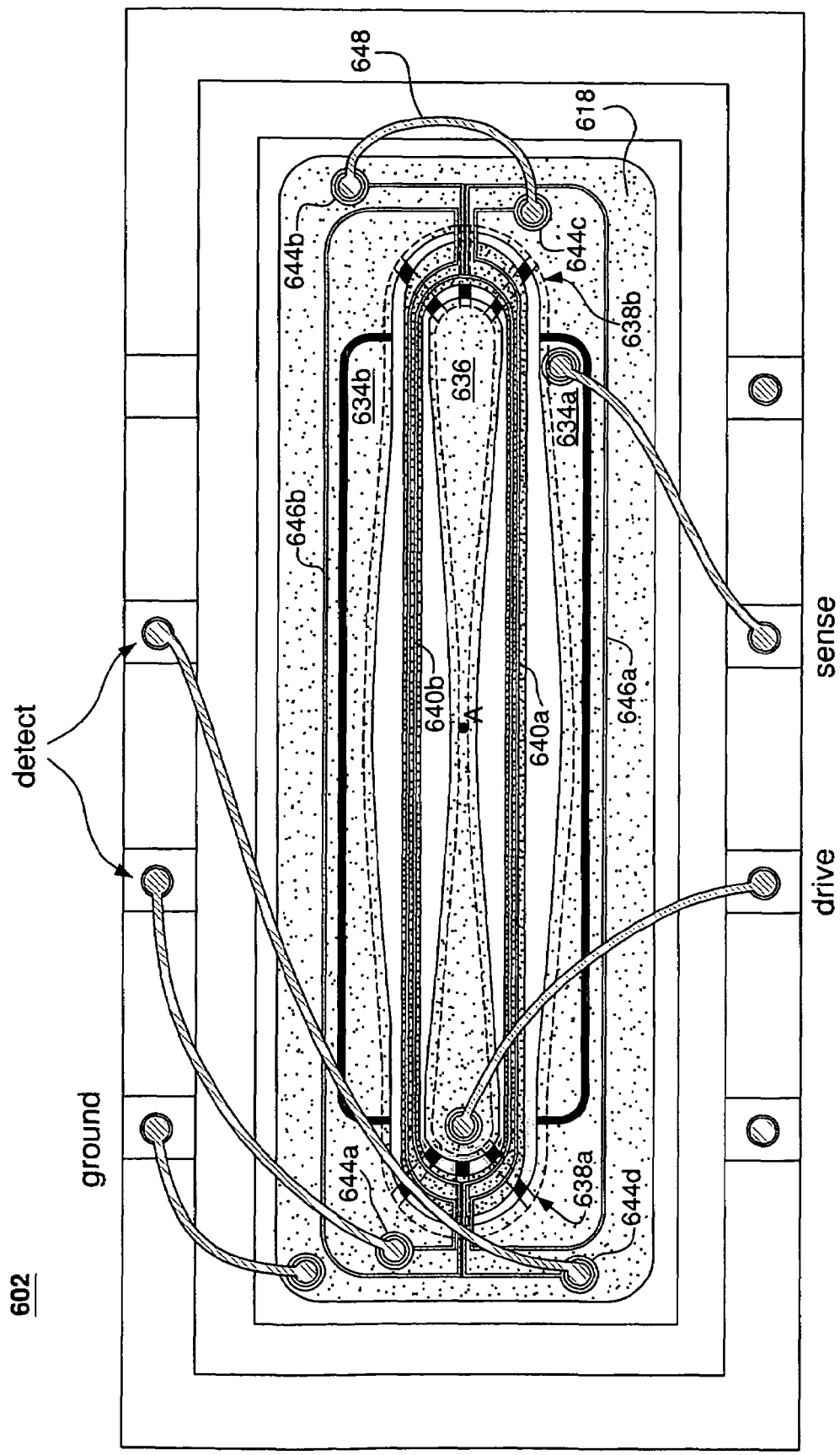
FIG. 6 shows a MEMS device with its wiring configuration that can be used as a sensor in the magnetometer of FIG. 1 according to yet another embodiment of the invention.

FIG. 6 shows a MEMS device 602 that can be used as sensor 102 in magnetometer 100 according to yet another embodiment of the invention. Device 602 is similar to device 502 of FIG. 5 in that device 602 has (i) a silicon nitride layer 618 deposited over the silicon overlayer of the SOI wafer, using which device 602 is formed, and (ii) metal tracks laid over the silicon nitride layer. However, devices 602 and 502 differ in the shape and position of their drive electrodes and in the shape of their oscillating beams. More specifically, the beam structure in device 602 resembles a pair of tuning forks that are joined together at their vibrating ends and that are anchored to the stationary part of the device using the fork handles. A drive electrode 636 is located within the inner opening of the beam structure. Drive electrode 636 is supported in the opening by two tripod-shaped support structures 638a-b, each attached between the respective electrode end and the stationary part of device 602. In one embodiment, support structures 638a-b are formed using the substrate layer of the SOI wafer. Note that portions of the intermediate silicon oxide layer located between the top of support structures 638a-b and the bottom of the beam structure are etched away to undercut the beam structure and make it attached to the stationary part of device 602 only at the fork handles.

Device 602 additionally has two electrodes 634a-b, each of which is structurally similar to electrode 534 of device 502. Each of electrodes 634a-b can be used as a sense electrode, e.g., analogous to sense electrode 234c of FIGS. 2 and 3. However, in the device wiring configuration of FIG. 6, only sense electrode 634a is wired for connection to a DD circuit, while electrode 634b is left free floating.

The beam structure in device 602 has two deformable beam members 640a-b, each having respective sections of metal tracks laid over it. More specifically, beam member 640a has sections of a spirally shaped metal track 646a, and beam member 640b has sections of a spirally shaped metal track 646b. Metal tracks 646a-b have substantially identical layouts and, in the view of FIG. 6, the layout of metal track 646b can be obtained by rotating the layout of metal track 646a by 180 degrees about point A, which is located at the center of drive electrode 636 and represents a center of symmetry for the tracks' layout. In view of this symmetry, the layout of only one of the metal tracks, i.e., metal track 646b, is described in detail below using the view of FIG. 6.

Metal track 646b begins at a contact pad 644a and goes over the left fork handle of the beam structure onto beam member 640b. Metal track 646b then runs along the outer rim of beam member 640b and leaves the beam structure over its right fork handle. Metal track 646b then loops around electrode 634b and contact pad 644a and reenters the beam structure over its left fork handle. Metal track 646b then runs along the inner rim of beam member 640b and leaves the beam structure over its right fork handle. Finally, metal track 646b terminates at a contact pad 644b.

Metal tracks 646a-b are wired together by electrically connecting contact pads 644b-c using a wire 648. Contact pads 644a and 644d are connected to a detect line that is similar to the detect line formed by wires 226a-b in FIG. 2. Device 602 wired in this manner can then be coupled to DD circuit 304 in substantially the same manner as device 202 (see FIG. 3).

When a periodic drive signal is applied to drive electrode 636, that drive signal causes beam members 640a-b to oscillate such that they move in opposite directions. For example, when beam member 640a is deflecting inwards, i.e., toward electrode 636, beam member 640b is also deflecting inwards, thereby moving in the opposite direction from that of beam member 640a. Similarly, when beam member 640a is deflecting outwards, i.e., away from electrode 636, beam member 640b is also deflecting outwards, thereby again moving in the opposite direction from that of beam member 640a. In the presence of a magnetic field, the fact that beam members 640a-b move in opposite directions causes the voltage differentials produced between (i) pads 644a and 644b and (ii) pads 644d and 644c to have opposite polarities. However, the wiring configuration of FIG. 6, where pad 644b is electrically connected to pad 644c, is such that these voltage differentials add up, rather than cancel each other. Similar to device 502 of FIG. 5, device 602 has a relatively large effective length of the sense beam member, which produces relatively high sensitivity/accuracy for magnetic-field measurements.

Figure 7:
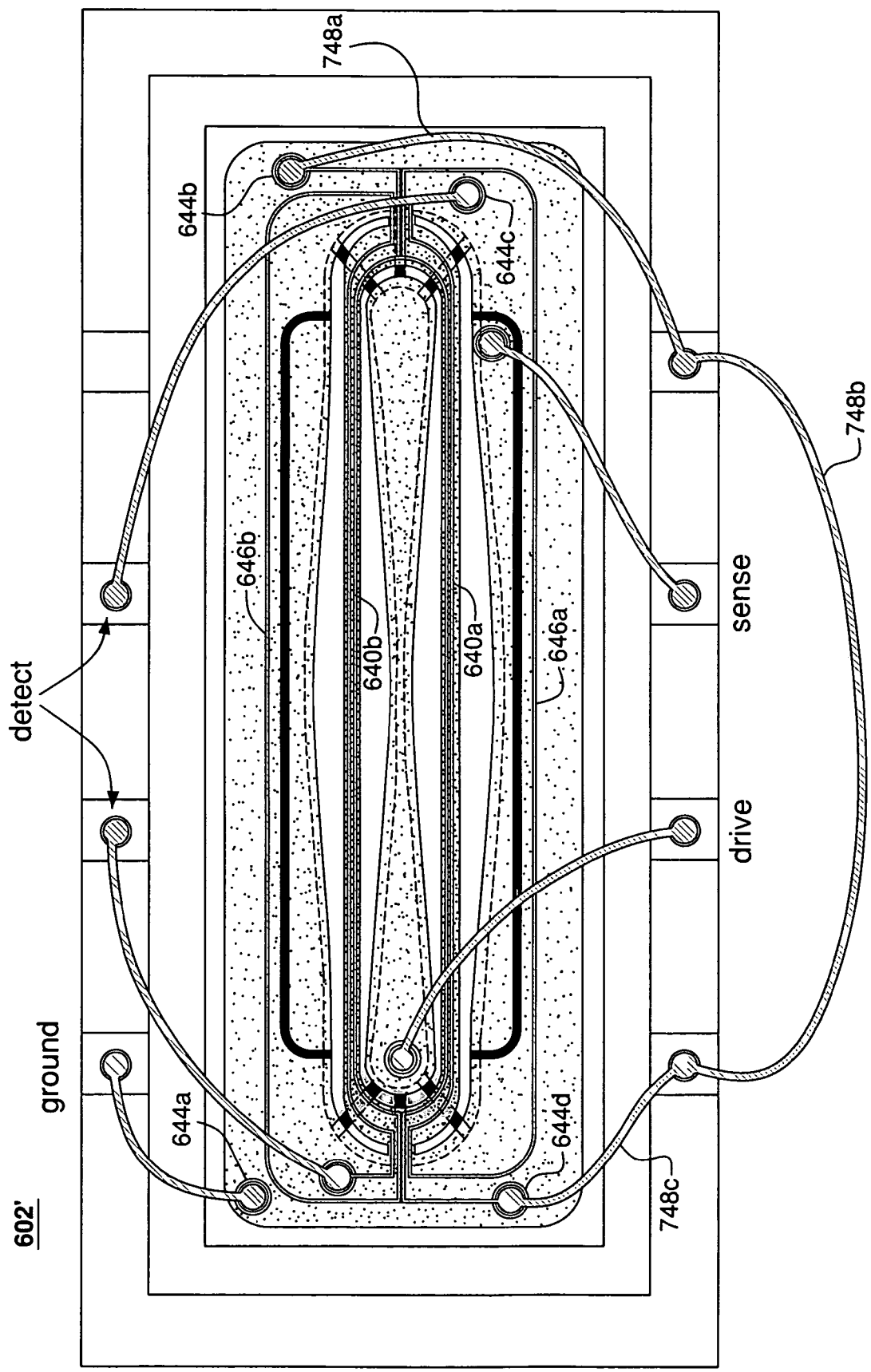
FIG. 7 shows another wiring configuration for the device shown in FIG. 6 according to another embodiment of the invention.

FIG. 7 shows another wiring configuration of device 602 according to one embodiment of the invention. More specifically, in the wiring configuration of FIG. 7, metal tracks 646a-b are wired together by electrically connecting contact pads 644b and 644d using three serially connected wires 748a-c, while contact pads 644a and 644c are connected to a detect line. If the magnetic-field strength at beam members 640a and 640b is the same, then, in the wiring configuration of FIG. 7, the voltage differentials produced between (i) pads 644a and 644b and (ii) pads 644d and 644c substantially cancel each other, thereby producing a null detect signal. However, if there is a magnetic field gradient between beam members 640a and 640b, then the voltage differentials produced by metal tracks 646a-b do not cancel each other, and the signal appearing at the detect line is a measure of that magnetic-field gradient. The wiring configuration of FIG. 7 might be useful, e.g., for detecting buried ferromagnetic wires that significantly distort the ambient magnetic field to produce a relatively strong magnetic-field gradient. One application of such wire detection is in a reader of wire-based labels that function as magnetic bar codes.

Figure 8:
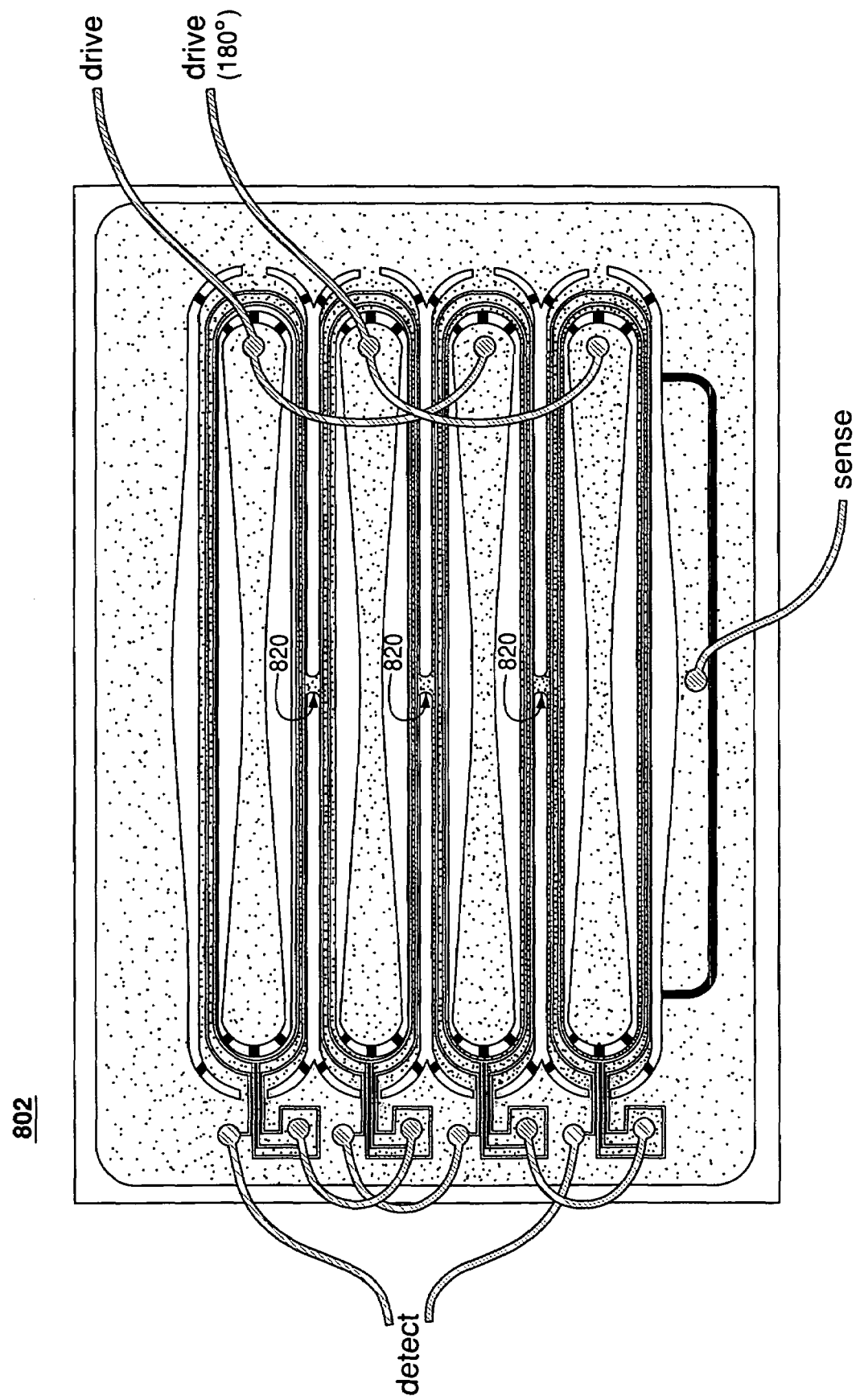
FIG. 8 shows a MEMS device that can be used as a sensor in the magnetometer of FIG. 1 according to yet another embodiment of the invention.

FIG. 8 shows a MEMS device 802 that can be used as sensor 102 in magnetometer 100 according to yet another embodiment of the invention. Device 802 is formed by substantially stacking four beam structures, each of which is analogous to the beam structure of device 602 (FIGS. 6 and 7), and mechanically coupling these beam structures using three bridges 820, each of which is analogous to bridge 420 of FIG. 4. Device 802 has four drive electrodes 836a-d, each of which is similar to drive electrode 636 of device 602. Drive electrodes 836a and 836c are wired together to receive a periodic drive signal, and drive electrodes 836b and 836d are similarly wired together to receive a 180-degree phase-shifted version of that periodic drive signal. A metal track laid over each of the beam structures has a spiral shape that makes each beam structure sensitive to the magnetic field strength similar to the wiring configuration of device 602 shown in FIG. 6. The metal tracks of different beam structures are serially connected to one another such that the signal applied to the detect line by device 802 is increased substantially four-fold compared to the signal that would be produced by a device having a single beam structure. Similar to device 602, device 802 can be rewired to be sensitive to the magnetic field gradient, rather than to the magnetic-field strength.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Although MEMS devices of the invention have been described in the context of silicon/silicon oxide SOI wafers, other suitable materials, such as germanium-compensated silicon, may similarly be utilized. The materials may be appropriately doped as known in the art. Various surfaces may be modified, e.g., by metal deposition for enhanced electrical conductivity or by ion implantation for enhanced mechanical strength. Differently shaped electrodes, pads, tracks, trenches, openings, and support structures may be implemented without departing from the scope and principle of the invention. For example, a spiral track analogous to, e.g., spiral track 542 of FIG. 5 can be implemented as a coil having some of its turns formed, with appropriate insulation, on top of the other turns. While serving a similar function as spiral track 542, this coil would differ from that track in that the coil would have a three-dimensional structure instead of a substantially flat structure of spiral track 542. Deformable beams and beam members may have different shapes and sizes, where the term "beam" refers in general to any suitable elastic structure that can recover its original shape after being distorted. The material of the beam itself may or may not be electrically conductive. In the latter case, a separate electrical pathway is provided along the beam, e.g., in the form of a conducting track, to enable electromechanical excitation of the beam and/or induction of an oscillating signal by the ambient magnetic field. If the material of the beam is electrically conductive, then the beam itself can be configured to serve as an electrical pathway. Various types of oscillators can be coupled to the beam and/or said electrical pathway to provide means for oscillating the beam. A different number of electrodes may be used in a device of the invention without departing from the scope and principles of the invention. Two or more devices of the invention may be arrayed and/or integrated on a chip with other circuitry, e.g., a DD circuit, as necessary and/or apparent to a person skilled in the art. Two or more variously oriented devices of the invention may be incorporated into a magnetometer to enable the magnetometer to sense variously oriented magnetic fields. Different types of phase-sensitive signal detection can be employed in place of lock-in detection.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, microsystems, and devices produced using microsystems technology or Microsystems integration.

Although the present invention has been described in the context of implementation as MEMS devices, the present invention can in theory be implemented at any scale, including scales larger than micro-scale.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An apparatus, comprising:
an oscillator;
a beam having an electrical pathway along its length, wherein the oscillator is configured to mechanically oscillate the beam to generate an oscillating electrical signal in the pathway in response to the beam being oscillated in a magnetic field;
a detection circuit electrically coupled to the pathway and being configured to generate a measure of the magnetic field based on the oscillating electrical signal; and
a substrate located near a portion of the beam, wherein the oscillator includes a drive circuit and a capacitor, the capacitor having a first electrode on the substrate and a second electrode on the beam, the drive circuit being capable of causing the beam to oscillate by applying an alternating voltage across the capacitor.

2. The invention of claim 1, wherein the detection circuit comprises a detector connected to:
receive an input signal corresponding to the oscillating electrical signal;
receive a reference signal corresponding to the alternating voltage; and
produce said measure based on phase-sensitive detection of the input signal with respect to the reference signal.

3. The invention of claim 1, wherein the drive circuit comprises:
another electrode attached to the substrate and located in proximity to the beam; and
an electrical loop adapted to couple the first electrode and said another electrodes and generate the alternating voltage, said electrical loop comprising an amplifier and a phase shifter serially connected with said amplifier.

4. The invention of claim 1, wherein the detection circuit comprises at least one of first and second compensation paths, each compensation path coupling the first electrode and the second electrode, wherein:
the first compensation path is adapted to reduce electrical crosstalk between the alternating voltage and the detected signal due to capacitive coupling between these signals through the capacitor; and
the second compensation path is adapted to take into account contribution of Earth's magnetic field into the detected signal.

5. The invention of claim 1, wherein:
the beam comprises:
a first beam member physically fixed at each end to the substrate;
a second beam member physically fixed at each end to the substrate; and
an electrically insulating bridge that mechanically connects intermediate parts of the first and second beam members, wherein the second electrode is on the first beam member and the pathway is on the second beam member.

6. The invention of claim 1, wherein the electrical pathway comprises a conducting track, wherein:
at least one section of said conducting track is laid over the beam; and
the oscillating electrical signal is generated along said conducting track.

7. The invention of claim 6, wherein said at least one section is electrically insulated from an underlying beam structure by an insulating layer of material.

8. The invention of claim 6, wherein:
said conducting track has a spiral shape; and
at least two sections of said conducting track that belong to different turns of the spiral are laid over the beam side by side to each other.

9. The invention of claim 1, wherein:
the beam comprises:
a first beam member physically fixed at each end to the substrate; and
a second beam member physically fixed at each end (i) to the substrate and (ii) to the respective end of the first beam member such as to form an opening between said first and second beam members; and
the oscillator comprises:
a drive circuit and an electrode attached to the substrate and located within said opening in proximity to the first and second beam members, wherein the drive circuit is adapted to generate a drive signal and apply said drive signal to the electrode to induce oscillation of the first and second beam members; and
a first conducting track, wherein:
at least one section of said conducting track is laid over at least one of the first and second beam members; and
at least a fraction of the oscillating electrical signal is generated along said conducting track.

10. The invention of claim 9, further comprising a second conducting track, wherein:
each of the first and second conducting tracks has a spiral shape;
at least two sections of the first conducting track that belong to different turns of the first track's spiral are laid over the first beam member side by side to each other; and
at least two sections of the second conducting track that belong to different turns of the second track's spiral are laid over the second beam member side by side to each other.

11. The invention of claim 9, further comprising a second conducting track, wherein:
the first and second conducting tracks are serially connected to each other;
the oscillating electrical signal is generated along said serially connected conducting tracks; and
said measure is a measure of the magnetic-field gradient.

12. The invention of claim 9, further comprising a second conducting track, wherein:
the first and second conducting tracks are serially connected to each other;
the oscillating electrical signal is generated along said serially connected conducting tracks; and
said measure is a measure of the magnetic-field strength.

13. The invention of claim 9, further comprising a second conducting track, wherein:
the first and second conducting tracks are adapted to be serially connected to each other;
the oscillating electrical signal is generated along said serially connected conducting tracks; and
the apparatus is adapted to support measurements of both the magnetic-field strength and the magnetic field gradient based on different connection configurations of the first and second conducting tracks.

14. The invention of claim 9, comprising two or more instances of the beam, wherein:
said instances are mechanically coupled to one another to enable joint oscillation of the beams; and
the oscillator comprises two or more instances of the electrode, wherein the drive circuit is adapted to generate two or more drive signals and apply said drive signals to the electrodes to induce the joint oscillation.

15. The invention of claim 1, wherein said measure is a measure of the magnetic-field gradient.

16. The invention of claim 1, wherein said measure is a measure of the magnetic-field strength.

17. The invention of claim 1, wherein the beam is implemented in a MEMS device formed on the substrate, wherein the MEMS device and the detection circuit are integrated on a single chip.

18. A method of generating a measure of a magnetic field, comprising:
oscillating a beam with respect to a substrate supporting the beam;
while oscillating the beam, exposing the beam to the magnetic field such that the magnetic field causes an oscillating electrical signal to be generated in an electrical pathway along the beam;
measuring the oscillating electrical signal to generate the measure of the magnetic-field; and
applying an alternating voltage across a capacitor, the capacitor having a first electrode on a portion of the substrate located near the beam and a second electrode on the beam, whereby causing the beam to oscillate with respect to the substrate.

19. An apparatus, comprising:
an oscillator;
a beam having an electrical pathway along its length, wherein the oscillator is configured to mechanically oscillate the beam to generate an oscillating electrical signal in the pathway in response to the beam being oscillated in a magnetic field; and
a detection circuit electrically coupled to the pathway and being configured to generate a measure of the magnetic field based on the oscillating electrical signal, wherein:
the electrical pathway comprises a conducting track;
at least one section of said conducting track is laid over the beam;
the oscillating electrical signal is generated along said conducting track;
said conducting track has a spiral shape; and
at least two sections of said conducting track that belong to different turns of the spiral are laid over the beam side by side to each other.

20. An apparatus, comprising:
an oscillator;
a beam having an electrical pathway along its length, wherein the oscillator is configured to mechanically oscillate the beam to generate an oscillating electrical signal in the pathway in response to the beam being oscillated in a magnetic field; and
a detection circuit electrically coupled to the pathway and being configured to generate a measure of the magnetic field based on the oscillating electrical signal, wherein:
the beam comprises:
a first beam member physically fixed at each end to a substrate; and
a second beam member physically fixed at each end (i) to the substrate and (ii) to the respective end of the first beam member such as to form an opening between said first and second beam members.

21. The invention of claim 20, wherein:
the oscillator comprises:
a drive circuit and an electrode attached to the substrate and located within said opening in proximity to the first and second beam members, wherein the drive circuit is adapted to generate a drive signal and apply said drive signal to the electrode to induce oscillation of the first and second beam members; and a first conducting track, wherein:
- at least one section of said conducting track is laid over at least one of the first and second beam members; and
- at least a fraction of the oscillating electrical signal is generated along said conducting track.

22. The invention of claim 21, further comprising a second conducting track, wherein:
- each of the first and second conducting tracks has a spiral shape;
- at least two sections of the first conducting track that belong to different turns of the first track's spiral are laid over the first beam member side by side to each other; and
- at least two sections of the second conducting track that belong to different turns of the second track's spiral are laid over the second beam member side by side to each other.

23. The invention of claim 21, further comprising a second conducting track, wherein:
- the first and second conducting tracks are serially connected to each other;
- the oscillating electrical signal is generated along said serially connected conducting tracks; and
- said measure is a measure of the magnetic-field gradient.

24. The invention of claim 21, further comprising a second conducting track, wherein:
- the first and second conducting tracks are serially connected to each other;
- the oscillating electrical signal is generated along said serially connected conducting tracks; and
- said measure is a measure of the magnetic-field strength.

25. The invention of claim 21, further comprising a second conducting track, wherein:
- the first and second conducting tracks are adapted to be serially connected to each other;
- the oscillating electrical signal is generated along said serially connected conducting tracks; and
- the apparatus is adapted to support measurements of both the magnetic-field strength and the magnetic field gradient based on different connection configurations of the first and second conducting tracks.

26. The invention of claim 21, comprising two or more instances of the beam, wherein:
- said instances are mechanically coupled to one another to enable joint oscillation of the beams; and
- the oscillator comprises two or more instances of the electrode, wherein the drive circuit is adapted to generate two or more drive signals and apply said drive signals to the electrodes to induce the joint oscillation.

* * * * *